(12) United States Patent
Liu et al.

(10) Patent No.: US 11,211,573 B2
(45) Date of Patent: Dec. 28, 2021

(54) MANUFACTURING METHODS FOR FLEXIBLE DISPLAY SCREENS AND COMPOSITE SUBSTRATES FOR FLEXIBLE DISPLAY SCREENS

(71) Applicant: KUNSHAN GO-VISIONOX OPTO-ELECTRONICS CO., LTD., Kunshan (CN)

(72) Inventors: Linjia Liu, Kunshan (CN); Yangjie Zhu, Kunshan (CN); Haifeng Lu, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 0 days.

(21) Appl. No.: 16/823,329

(22) Filed: Mar. 19, 2020

(65) Prior Publication Data
US 2020/0220092 A1 Jul. 9, 2020

Related U.S. Application Data

(63) Continuation of application No. PCT/CN2019/072028, filed on Jan. 16, 2019.

(30) Foreign Application Priority Data

Aug. 2, 2018 (CN) .................. 201810870402.5

(51) Int. Cl.
*H01L 51/00* (2006.01)
*H01L 51/56* (2006.01)

(52) U.S. Cl.
CPC ........ *H01L 51/0097* (2013.01); *H01L 51/003* (2013.01); *H01L 51/56* (2013.01); *H01L 2251/5338* (2013.01); *H01L 2251/558* (2013.01)

(58) Field of Classification Search
None
See application file for complete search history.

(56) References Cited

U.S. PATENT DOCUMENTS 9,472,650 B2    10/2016  Koo et al.
2011/0059561 A1  3/2011  Liao et al.
(Continued)

FOREIGN PATENT DOCUMENTS

CN    102013414 A    4/2011
CN    104051496 A    9/2014
(Continued)

OTHER PUBLICATIONS

Bakr, Nabeel A, et al. "Determination of the Optical Parameters of a-Si:H Thin Films Deposited by Hot Wire-Chemical Vapour Deposition Technique Using Transmission Spectrum Only." Pramana, vol. 76, No. 3, 2011, pp. 519-531., doi:10.1007/s12043-011-0024-4. (Year: 2011).*

(Continued)

*Primary Examiner* — J. E. Schoenholtz
(74) *Attorney, Agent, or Firm* — Kilpatrick Townsend & Stockton

(57) ABSTRACT

The present disclosure relates to a composite substrate adapted for manufacturing a flexible display screen. The composite substrate includes a base substrate, a sacrificial layer, and a flexible layer. The sacrificial layer is located on the base substrate. The flexible layer is located on the sacrificial layer. The sacrificial layer is an inorganic layer which contains hydrogen element and is semi-transparent. The present disclosure further provides a method for manufacturing a flexible display screen, comprising: depositing a sacrificial layer on a base substrate, the sacrificial layer is an inorganic layer, the inorganic layer contains hydrogen element and is semi-transparent; forming a flexible layer on the sacrificial layer; forming electronic components on the flex- (Continued)

ible layer; and irradiating the sacrificial layer by a laser beam to cause the hydrogen element in the sacrificial layer to form hydrogen gas bubbles, so as to separate the base substrate and the sacrificial layer.

20 Claims, 2 Drawing Sheets

(56) References Cited

U.S. PATENT DOCUMENTS

| | | | |
|---|---|---|---|
| 2014/0008657 | A1 | 1/2014 | Lu et al. |
| 2015/0125972 | A1 | 5/2015 | Yoo et al. |
| 2016/0190523 | A1* | 6/2016 | Kim .................. H01L 51/5253 438/23 |
| 2016/0211350 | A1* | 7/2016 | Koo ...................... H01L 51/003 |
| 2018/0047609 | A1 | 2/2018 | Ohno et al. |

FOREIGN PATENT DOCUMENTS

| | | |
|---|---|---|
| CN | 104201283 A | 12/2014 |
| CN | 102769109 B | 5/2015 |
| CN | 105810102 A | 7/2016 |
| CN | 104616596 B | 10/2016 |
| CN | 108172543 A | 6/2018 |
| CN | 108807671 A | 11/2018 |
| CN | 208655700 U | 3/2019 |
| KR | 20120073904 A | 7/2012 |
| TW | 201808628 A | 3/2018 |
| TW | 201810754 A | 3/2018 |
| TW | 201825298 A | 7/2018 |
| WO | 2020024564 A1 | 2/2020 |

OTHER PUBLICATIONS

International Search Report dated Apr. 30, 2019 in the corresponding international application (application No. PCT/CN2019/072028).
TW First Office Action with search report dated Nov. 25, 2019 in the corresponding TW application (application No. 108103571).
Office Action of KR Patent Application No. 10-2020-7017800.

* cited by examiner

MANUFACTURING METHODS FOR FLEXIBLE DISPLAY SCREENS AND COMPOSITE SUBSTRATES FOR FLEXIBLE DISPLAY SCREENS

CROSS-REFERENCES TO RELATED APPLICATIONS

This application is a continuation under 35 U.S.C. § 120 of international patent application PCT/CN2019/072028 filed on Jan. 16, 2019, the content of which is also hereby incorporated by reference. This application claims priority under 35 U.S.C. § 119 from China Patent Application No. 201810870402.5, filed on Aug. 2, 2018 in the China National Intellectual Property Administration, the content of which is hereby incorporated by reference.

TECHNICAL FIELD

The present disclosure relates to a flexible display technology.

BACKGROUND

The active-matrix organic light emitting diode (AMOLED) display technology has been widely applied in recent years. There have been various challenges associated with AMOLED manufacturing processes; new and improved techniques are desired.

SUMMARY

The present disclosure provides a method and a composite substrate for manufacturing a flexible display screen. A sacrificial layer having hydrogen element is disposed between a base substrate and a flexible layer to address black spot or black dot issues caused by a laser lift-off (LLO) process.

A composite substrate for manufacturing a flexible display screen is provided. The composite substrate includes a base substrate, a sacrificial layer, and a flexible layer. The sacrificial layer is located on the base substrate. The flexible layer is located on the sacrificial layer. The sacrificial layer is an inorganic layer, and the inorganic layer contains hydrogen element and is semi-transparent.

In an embodiment, the sacrificial layer is manufactured by chemical vapor deposition without dehydrogenation.

In an embodiment, an atomic percent of hydrogen atoms in the sacrificial layer is larger than 2%.

In an embodiment, the atomic percent of the hydrogen atoms in the sacrificial layer is about 5% to about 10%.

In an embodiment, the sacrificial layer is a monolayer structure.

In an embodiment, a host material of the sacrificial layer is amorphous silicon, silicon carbide, or gallium nitride.

In an embodiment, a host material of the sacrificial layer is amorphous silicon, and a thickness of the sacrificial layer is smaller than 20 nm.

In an embodiment, a host material of the sacrificial layer is amorphous silicon, and a thickness range of the sacrificial layer is 5 nm to 10 nm.

In an embodiment, a host material of the sacrificial layer is silicon carbide, and a thickness range of the sacrificial layer is smaller than 30 nm.

In an embodiment, a host material of the sacrificial layer is silicon carbide, and a thickness range of the sacrificial layer is 10 nm to 20 nm.

In an embodiment, a host material of the sacrificial layer is gallium nitride, and a thickness of the sacrificial layer is smaller than 30 nm.

In an embodiment, a host material of the sacrificial layer is gallium nitride, and thickness range of the sacrificial layer is 10 nm to 20 nm.

In an embodiment, a material for the base substrate is glass.

In an embodiment, a material of the flexible layer is polyimide.

A method for manufacturing a flexible display screen is further provided. The method includes:

providing a base substrate;

depositing a sacrificial layer on the base substrate, the sacrificial layer is an inorganic layer, the inorganic layer contains hydrogen element and is semi-transparent;

forming a flexible layer on the sacrificial layer;

forming electronic components on the flexible layer; and irradiating the sacrificial layer by a laser beam to cause the hydrogen element in the sacrificial layer to form hydrogen gas bubbles, and separating the base substrate and the sacrificial layer.

In an embodiment, the sacrificial layer is formed on the base substrate through chemical vapor deposition of hydrogen-containing material.

In an embodiment, no dehydrogenation is performed on the sacrificial layer after the sacrificial layer is formed through the chemical vapor deposition.

In an embodiment, an atomic percent of hydrogen atoms in the sacrificial layer is 5% to 10%.

In an embodiment, the hydrogen-containing material is $SiH_4$.

In an embodiment, a power of the laser beam is 19 W to 22.5 W.

The details of one or more embodiments of this application are set forth in the accompanying drawings and description below. Other features, objects and advantages of the present application will become apparent from the description, the accompanying drawings, and the claims.

DETAILED DESCRIPTION OF THE INVENTION

As mentioned above, there are various challenges associated with AMOLED manufacturing. Among other things, it is difficult to peel off a polyimide (PI) substrate from a glass substrate and easy to damage the flexible substrate in the laser lift-off (LLO) process of the AMOLED flexible substrate because of a strong binding force between the PI substrate and the glass substrate. Consequently, moisture can penetrate the flexible substrate and degrade the organic light-emitting material, cause black spots or black dots when the organic light emitting diodes emitting lights. Inn the related art, to address this problem, a sandwich structure of organic layer/amorphous silicon/organic layer is disposed between the glass substrate and the flexible substrate. However, such multi-layered structure increases the production cost and complicates the manufacturing process, resulting in a low production capacity.

Figure 1:
FIG. 1 is a schematic cross-section view of a composite substrate for manufacturing a flexible display screen according to an embodiment of the present disclosure.

Referring to FIG. 1, a composite substrate for manufacturing a flexible display screen is provided in an embodiment of the present disclosure. The composite substrate 400 includes a base substrate 100, a sacrificial layer 200, and a flexible layer 300.

The base substrate 100 can be a glass layer, which is rigid to provide support to the flexible layer 300 and capable of having a laser beam penetrating there through in a laser lift-off process. In the present disclosure, the glass layer can be selected, without other particular requirements, in accordance with conventional practice in the art.

The sacrificial layer 200 is located on the base substrate 100. The sacrificial layer 200 can be an inorganic layer containing hydrogen element and is semi-transparent. The inorganic layer can be selected according to binding force needed between the base substrate 100 and the flexible layer 300. Any inorganic layer which contains hydrogen element and is semi-transparent can be selected as long as it can provide suitable binding force.

In an embodiment, the sacrificial layer 200 can be formed on the base substrate 100 through chemical vapor deposition of hydrogen-containing material. As such, the hydrogen element can be inherently included in the formed sacrificial layer 200. In the OLED technical field, a dehydrogenation process is conventionally required after manufacturing the inorganic layer through the chemical vapor deposition, so as to obtain an inorganic layer containing less or no hydrogen element. Instead, in the present disclosure, no dehydrogenation is performed on the sacrificial layer 200 formed by the chemical vapor deposition, so that the hydrogen element is maintained in the sacrificial layer 200.

In an embodiment, an atomic percent (the percentage of the number of atoms) of hydrogen atoms in the sacrificial layer 200 is larger than 2%, for example, about 5% to about 10%. The atomic percent of the hydrogen atoms can be measured by secondary ion mass spectroscopy (SIMS).

In an embodiment, a host material of the sacrificial layer 200 is amorphous silicon, silicon carbide (SiC), or gallium nitride (GaN). The amorphous silicon can be a-Si. The material of the sacrificial layer 200 is not limited thereto, and person skilled in the art can select other suitable inorganic materials according to the teachings in the present disclosure.

In the present disclosure, the reason for referring amorphous silicon, SiC, or GaN as the host material of the sacrificial layer 200 is that, besides the host material, the hydrogen element is also included (or remained) in the sacrificial layer 200 and has a relatively low content, for example, within a range from about 5% to about 10% by atom.

In an embodiment, the host material of the sacrificial layer 200 is amorphous silicon. The sacrificial layer 200 has a thickness smaller than 20 nanometers (nm). For example, the thickness of the sacrificial layer 200 can be about 5 nm to about 10 nm. Within such thickness range, the sacrificial layer 200 can be in a semi-transparent state and have a relatively high light transmittance, so that the alignment step in the manufacturing process of the flexible display screen is relatively easy to proceed, and the contrast of the alignment mark used in the manufacturing process is enhanced, thereby facilitating the cutting process. Moreover, the heat generated in the laser lift-off process can be absorbed to promote the reaction of the hydrogen element to generate hydrogen gas bubbles, thereby decreasing the binding force between the sacrificial layer 200 and the flexible layer 300, facilitating the separation of the flexible layer 300 from the base substrate 100, and avoiding the damage to the flexible layer 300 caused by the laser.

In another embodiment, the host material of the sacrificial layer 200 is silicon carbide. The thickness of the sacrificial layer 200 is smaller than 30 nm, for example, can be about 10 nm to about 20 nm.

In another embodiment, the host material of the sacrificial layer 200 is gallium nitride. The thickness of the sacrificial layer 200 is smaller than 30 nm, for example, can be about 10 nm to about 20 nm.

The flexible layer 300 is located on the sacrificial layer 200. A material of the flexible layer 300 can be selected in accordance with conventional practice in the art. In an embodiment, the material of the flexible layer 300 in the present disclosure is polyimide (PI).

Figure 2:
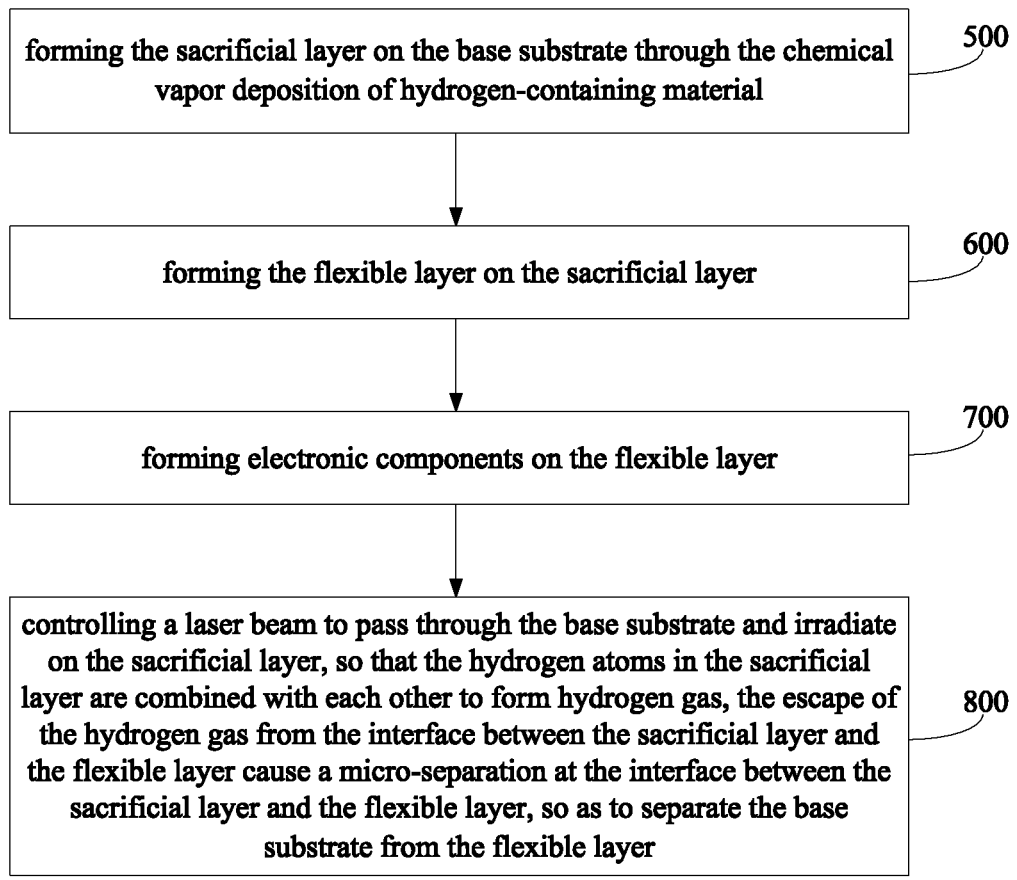
FIG. 2 is a flow chart showing steps of a laser lift-off process according to an embodiment of the present disclosure.

Referring to FIG. 2, a method for manufacturing the flexible display screen is provided in an embodiment of the present disclosure. The method includes steps S500 to S800.

S500 is forming the sacrificial layer 200 on the base substrate 100 through the chemical vapor deposition of hydrogen-containing material. It is to be understood that the material and the forming method are not limited thereto in other embodiments.

In an embodiment, the hydrogen-containing material is silane ($SiH_4$).

In an embodiment, no dehydrogenation is performed on the sacrificial layer 20 after the chemical vapor deposition to maintain the hydrogen content in the sacrificial layer 20, which is different from the conventional method for forming the sacrificial layer through the chemical vapor deposition.

In an embodiment, the hydrogen content in the sacrificial layer 200 can be regulated by controlling the conditions of the chemical vapor deposition, so as to have the percentage of the number of the hydrogen atoms in the sacrificial layer 200 larger than 2%, for example within a range from about 5% to about 10%, such as, being about 5%, 6%, 7%, 8%, 9%, or 10%.

In an embodiment, the thickness of the sacrificial layer 200 can be regulated by controlling the conditions of the chemical vapor deposition, so as to obtain the semi-transparent inorganic layer.

In an embodiment, the material of the sacrificial layer 200 is amorphous silicon. The thickness of the sacrificial layer 200 can be smaller than 20 nm, for example, about 5 nm to about 10 nm, such as about 5 nm, 6 nm, 7 nm, 8 nm, 9 nm, or 10 nm.

In another embodiment, the material of the sacrificial layer 200 is silicon carbide. The thickness of the sacrificial layer 200 can be smaller than 30 nm, for example, about 10 nm to about 20 nm, such as about 10 nm, 12 nm, 15 nm, 18 nm, or 20 nm.

In another embodiment, the material of the sacrificial layer 200 is gallium nitride. The thickness of the sacrificial layer 200 can be smaller than 30 nm, for example, about 10 nm to about 20 nm, such as about 10 nm, 12 nm, 15 nm, 18 nm, or 20 nm.

S600 is forming the flexible layer 300 on the sacrificial layer 200.

S700 is forming electronic components and other structures contained in the flexible display screen, including but not limited to, TFTs, OLEDs, module layers, and wirings, on the flexible layer 300. The components and their manufacturing processes are already well known, and the present disclosure is focused on the laser lift-off process; therefore, the manufacturing steps of these components will not be described in detail herein.

S800 is controlling a laser beam to pass through the base substrate 100 and irradiate the sacrificial layer 200, so that the hydrogen atoms in the sacrificial layer 200 are combined with each other to form hydrogen gas. Hydrogen gas bubbles are generated and cause a micro-separation at an interface between the sacrificial layer 200 and the flexible layer 300, thereby decreasing the binding force between the sacrificial layer 200 and the flexible layer 300. Consequently, the force borne by the flexible layer 300 is decreased, and the possibility of damaging the flexible layer 300 is reduced, so that the base substrate 100 and the flexible layer 300 can be easily separated.

A power of the laser beam is not particularly limited. The power can be slightly greater than a power used for separating the base substrate 100 from the flexible layer 300 directly attached to the base substrate 100. For example, the power can be about 19 W to about 22.5 W. Generally, the power of the laser beam is increased with the thickness of the sacrificial layer 200. In an embodiment, the thickness of the sacrificial layer 200 is about 5 nm, and the power of the laser beam can be about 19.3 W. In another embodiment, the thickness of the sacrificial layer 200 is about 10 nm, and the power of the laser beam can be about 22.1 W.

The advantages of the methods and the composite substrates for manufacturing the flexible display screen of the present disclosure will be further described below with reference to the specific examples and comparative examples.

COMPARATIVE EXAMPLE

Existing and conventional composite substrates are used to manufacture flexible display screens. Each composite substrate includes a base substrate 100 and a flexible layer 300. The base substrate 100 is a glass layer. The flexible layer 300 is a polyimide (PI) layer.

After the manufacturing of the flexible display screen, the laser lift-off is performed to separate the base substrate 100 from the composite substrate. More specifically, a laser beam with a power of about 14.9 W is irradiated on the composite substrate from the side of the base substrate 100, and then the base substrate 100 and the flexible layer 300 are separated from each other.

After the laser lift-off process, 69 manufactured flexible display screens are tested, and 4 of them exhibit black spots or black dots, taking 5.8% of the total number.

Example 1

The composite substrates disclosed in the present disclosure are used to manufacture flexible display screens. Each composite substrate includes a base substrate 100, a sacrificial layer 200, and a flexible layer 300 arranged in sequence. The base substrate 100 is a glass layer having the material and the thickness same as that of the comparative example. The flexible layer 300 is a polyimide layer having the material and the thickness same as that of the comparative example. The sacrificial layer 200 is an amorphous silicon (a-Si) layer manufactured by the chemical vapor deposition process and is not undergone the dehydrogenation process. The a-Si layer has a thickness of about 5 nm.

After the manufacturing of the flexible display screen, the laser lift-off is performed to separate the base substrate 100 from the composite substrate. More specifically, a laser beam with a power of about 19.3 W is irradiated on the composite substrate from the side of the base substrate 100, and then the base substrate 100 and the sacrificial layer 200 are separated from each other.

After the laser lift-off process, 41 manufactured flexible display screens are tested, and none of them exhibit black spots or black dots. The occurrence rate of the black spots and black dots is zero.

Example 2

The composite substrates disclosed in the present disclosure are used to manufacture flexible display screens. The structure of the composite substrates is the same as that in the example 1. The sacrificial layer 200 in the composite substrate is an a-Si layer manufactured by the same method as that in the example 1. The a-Si layer has a thickness of about 10 nm.

After the manufacturing of the flexible display screens, the laser lift-off is performed to separate the base substrate 100 from the composite substrate. More specifically, a laser beam with a power of about 22.1 W is irradiated on the composite substrate from the side of the base substrate 100, and then the base substrate 100 and the sacrificial layer 200 were separated from each other.

After the laser lift-off process, 45 manufactured flexible display screens are tested, and none of them exhibit black spots or black dots. The occurrence rate of the black spots and black dots is zero.

As shown in examples 1 to 2 and comparative example, 4/69 of the organic light emitting diode flexible display screens without using the sacrificial layer have the black spots or the black dots. The occurrence rate of the black spots or the black dots is 5.80%. 0/86 of the organic light emitting diode flexible display screens adopting the a-Si layer as the sacrificial layer have the black spots or the black dots. The occurrence rate of the black spots or the black dots is zero. It is noted that no black spot or black dot occurs when the thickness of the a-Si layer is about 5 nm to about 10 nm.

Therefore, by disposing the a-Si layer between the glass layer and the PI layer, the damage rate of the PI layer and the binding force between the glass layer and the PI layer can be substantially reduced, and the separation effect in the laser lift-off process can be improved, thereby protecting the PI layer and decreasing the occurrence rate of the black spots or the black dots.

In addition, the influence of the hydrogen atom content on the sacrificial layers having the same thickness is further tested by regulating the parameters of the chemical vapor deposition. It is found that when the atomic percent of the hydrogen atoms in the sacrificial layer is between about 5% and about 10%, an optimal effect of separating the base substrate from the flexible layer can be achieved. Of course, the atomic percent of the hydrogen atoms in the sacrificial layer is not limited within this range, the occurrence rate of the black spots or the black dots can be reduced as long as the atom number percentage is larger than 2%.

The embodiments of the present disclosure have the following advantages.

The sacrificial layer not only provides sufficient binding force between the base substrate and flexible layer, but is also a semi-transparent inorganic layer, so that the flexible layer can be observed through the base substrate and the sacrificial layer to facilitate the alignment in the manufacturing process of the flexile display screen. Moreover, the energy of the laser lift-off can be adsorbed by the sacrificial layer to promote the conversion of the residual hydrogen element into hydrogen gas, which results small bubbles. These small bubbles facilitate the separation of the sacrificial layer from the flexible layer and decrease the binding force between the base substrate and the flexible layer, thereby improving the separation effect of the laser lift-off process, and reducing the occurrence rate of the black spots and black dots.

The sacrificial layer can be a mono-layered inorganic layer with no additional organic layer. Compared to a multi-layered structure, the flexible substrate in the present disclosure has a simper structure, so that the production cost can be substantially decreased, the production capacity can be increased.

The sacrificial layer can have a thickness smaller than 20 nm, for example, within a range from about 5 nm to about 10 nm. As such, the light transmittance of the flexible substrate will not be affected by a thick sacrificial layer. The flexible substrate can have a very high light transmittance to increase the contract of the alignment mark, thereby achieving the accurate alignment and facilitating the following cutting process.

The material of the sacrificial layer can be flexibly selected from amorphous silicon, silicon carbide, or gallium nitride according to practical manufacturing process.

What described above are only embodiments of the present disclosure. These embodiments are specific and detailed, but not intended to limit the scope of the present disclosure. It should be understood by person skilled in the art that various modifications and improvements can be made without departing from the concept of the present disclosure, and all fall within the protection scope of the present disclosure. Therefore, the patent protection scope of the present disclosure is defined by the appended claims.

The invention claimed is:

1. A composite substrate, adapted for manufacturing a flexible display screen, comprising:
    a base substrate;
    a sacrificial layer located on the base substrate, the sacrificial layer being an inorganic layer, the inorganic layer comprising a hydrogen element and being semi-transparent; and
    a flexible layer disposed on the sacrificial layer, the flexible layer being an integrated structure, the flexible layer being configured to form electronic components thereon;
    wherein the sacrificial layer is configured to be semi-transparent for enhanced light-transmittance and accurate alignment during manufacturing of the flexible display screen.

2. The composite substrate of claim 1, wherein an atomic percent of hydrogen atoms in the sacrificial layer is greater than 2% and less than or equal to 10%.

3. The composite substrate of claim 2, wherein the atomic percent of the hydrogen atoms in the sacrificial layer is about 5% to 10%.

4. The composite substrate of claim 1, wherein the sacrificial layer is a monolayer structure.

5. The composite substrate of claim 1, wherein a host material of the sacrificial layer is amorphous silicon, silicon carbide, or gallium nitride.

6. The composite substrate of claim 1, wherein a host material of the sacrificial layer is amorphous silicon, and a thickness of the sacrificial layer is smaller than 20 nm.

7. The composite substrate of claim 6, wherein the thickness range of the sacrificial layer is substantially 5 nm to 10 nm.

8. The composite substrate of claim 1, wherein a host material of the sacrificial layer is silicon carbide, and a thickness of the sacrificial layer is smaller than 30 nm.

9. The composite substrate of claim 8, wherein the thickness of the sacrificial layer is substantially 10 nm to 20 nm.

10. The composite substrate of claim 1, wherein a host material of the sacrificial layer is gallium nitride, and a thickness of the sacrificial layer is smaller than 30 nm.

11. The composite substrate of claim 10, wherein the thickness of the sacrificial layer is substantially 10 nm to 20 nm.

12. The composite substrate of claim 1, wherein the base substrate is a glass layer.

13. The composite substrate of claim 1, wherein a material of the flexible layer is polyimide.

14. A method for manufacturing a flexible display screen, comprising:
    providing a base substrate;
    depositing a sacrificial layer on the base substrate, the sacrificial layer being an inorganic layer, the inorganic layer comprising hydrogen element and being semi-transparent;
    forming a flexible layer on the sacrificial layer, the flexible layer being an integrated structure;
    forming electronic components on the flexible layer; and
    irradiating the sacrificial layer by a laser beam to cause the hydrogen element in the sacrificial layer to form hydrogen gas bubbles, and
    separating the base substrate and the sacrificial layers;
    wherein the sacrificial layer is configured to be semi-transparent for enhanced light-transmittance and accurate alignment during manufacturing of the flexible display screen.

15. The method of claim 14, wherein the sacrificial layer is formed on the base substrate through chemical vapor deposition of a hydrogen-containing material.

16. The method of claim 15, wherein no dehydrogenation is performed on the sacrificial layer after the sacrificial layer is formed through the chemical vapor deposition.

17. The method of claim 15, wherein an atomic percent of hydrogen atoms in the sacrificial layer is about 5% to 10%.

18. The method of claim 15, wherein the hydrogen-containing material is $SiH_4$.

19. The method of claim 14, wherein a power of the laser beam is about 19 W to 22.5 W.

20. A composite substrate, adapted for manufacturing a flexible display screen, comprising:
    a base substrate;
    a sacrificial layer located on the base substrate, the sacrificial layer being configured to be semi-transparent for enhanced light-transmittance and accurate alignment during manufacturing of the flexible display screen; and
    a flexible layer disposed on the sacrificial layer, the flexible layer being an integrated structure, the flexible layer being configured to form electronic components thereon.

* * * * *